United States Patent
Cho

(10) Patent No.: US 7,256,409 B2
(45) Date of Patent: Aug. 14, 2007

(54) OPTICAL SENSOR CIRCUIT COMBINING FUNCTIONS OF OPEN AND CLOSE TYPE OPTICAL SENSOR CIRCUITS

(75) Inventor: Sin-Hyun Cho, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/264,173

(22) Filed: Nov. 2, 2005

(65) Prior Publication Data

US 2006/0138365 A1 Jun. 29, 2006

(30) Foreign Application Priority Data

Dec. 23, 2004 (KR) .................. 10-2004-0110967

(51) Int. Cl.
*G02B 27/00* (2006.01)
*G01J 1/44* (2006.01)
*H03K 17/78* (2006.01)

(52) U.S. Cl. ............ 250/551; 250/214 R; 250/214 SW

(58) Field of Classification Search .............. 250/551, 250/214 R, 214 SW

See application file for complete search history.

(56) References Cited

U.S. PATENT DOCUMENTS

| 5,117,118 | A | * | 5/1992 | Fukuyama ................ 250/551 |
| 5,175,487 | A | * | 12/1992 | Inoue ..................... 323/303 |
| 5,252,820 | A | * | 10/1993 | Shinomiya ............. 250/214 R |
| 5,258,823 | A | * | 11/1993 | Akamatsu .................. 356/615 |
| 5,707,893 | A | | 1/1998 | Bhatt et al. |
| 5,734,170 | A | * | 3/1998 | Ikeda ..................... 250/551 |
| 2003/0174238 | A1 | * | 9/2003 | Wu ........................ 348/373 |
| 2004/0179209 | A1 | | 9/2004 | Besch |

* cited by examiner

*Primary Examiner*—Thanh X. Luu
*Assistant Examiner*—Brian Livedalen
(74) *Attorney, Agent, or Firm*—Volentine & Whitt, PLLC

(57) ABSTRACT

An optical sensor circuit comprises an optical sensor adapted to sense a position of a component in a semiconductor manufacturing apparatus according to the presence or absence of a flag and output a signal indicative of the position. A position sensing driver receives the signal via a path selected by a plurality of switches and then drives an output signal in response to the signal. The path selected by the plurality of switches causes the optical sensor circuit to act as either a close-type optical sensor circuit or an open-type optical sensor circuit.

15 Claims, 3 Drawing Sheets

OPTICAL SENSOR CIRCUIT COMBINING FUNCTIONS OF OPEN AND CLOSE TYPE OPTICAL SENSOR CIRCUITS

BACKGROUND OF THE INVENTION

1. Field of the Invention

The present invention relates generally to an optical sensor circuit for a semiconductor manufacturing device. More particularly, the invention relates to an optical sensor circuit that combines the functions of both "open-type" and "close-type" optical sensor circuits into a single optical sensor circuit.

A claim of priority is made to Korean Patent Application No. 10-2004-0110967 filed Dec. 23, 2004, the disclosure of which is hereby incorporated by reference in its entirety.

2. Discussion of Related Art

Optical sensors are commonly used to detect the positions and/or orientations of various components within a piece of semiconductor manufacturing equipment. For instance, optical sensors may be used to detect whether a printed circuit board is properly positioned or whether parts of the equipment such as doors, valves, and so forth, are properly positioned (e.g., open, closed, tilted, rotated, etc.). The optical sensors are generally coupled to or associated with actuators such as pivot motors, door motors, and air springs, which are used to adjust the positions and/or orientations of the various components.

An ion-implantation apparatus is one type of equipment that uses optical sensors. In an ion implantation apparatus, components such as isolation valves, faradays, and load lock chambers, are monitored by optical sensors. For example, the optical sensors may detect whether the load lock chambers or the or the isolation valves are properly opened or closed. In addition, the optical sensors may be used to determine whether an ion source or a substrate is in a proper position for ion-implantation to take place.

In a "close-type" optical sensor circuit, when an obstruction, or "flag", prevents a light emitting diode (LED) from transmitting light to a light receiving transistor, the optical sensor circuit outputs a signal with a logic state "low" (i.e., a "low signal"). In contrast, in an "open-type" optical sensor circuit, when a flag prevents the LED from transmitting light to the light receiving transistor, the optical sensor circuit outputs a signal with a logic state "high" (i.e., a "high signal").

FIG. 1 is a circuit diagram of a conventional "close-type" optical sensor circuit and FIG. 2 is a circuit diagram of a conventional "open-type" optical sensor circuit.

Referring to FIG. 1, the conventional close-type optical sensor circuit comprises an optical sensor 10, a position sensing driver 12, and a LED "LED1". The close-type optical sensor circuit further comprises a first resistor R1 and a second resistor R2 connected to optical sensor 10.

Optical sensor 10 comprises a LED D1 and a light receiving transistor TR1 that is turned on in response to light emitted from LED D1. A flag "FLAG" is inserted or input between LED D1 and light receiving transistor TR1 to prevent the light emitted from LED D1 from turning on light receiving transistor TR1.

Position sensing driver 12 comprises a transistor 12 having a base connected to an emitter of light receiving transistor TR1, a collector connected to an output of LED "LED1", and an emitter connected to an output of the close-type optical sensor circuit.

The operation of the close-type optical sensor circuit is as follows. Where flag "FLAG" is not interposed between LED D1 and light receiving transistor T1, the emitter of light receiving transistor T1 assumes logic state "high", causing transistor Q1 to turn on. Accordingly, current flows through LED "LED1", causing it to turn on, and as a result, the emitter of transistor Q1 assumes logic state "high". In contrast, where flag "FLAG" is interposed between LED D1 and light receiving transistor T1, the emitter of light receiving transistor T1 assumes logic state "low", causing transistor Q1 to turn off. Accordingly, no current flows through LED "LED1", and as a result, the emitter of transistor Q1 assumes logic state "low".

The operation of the close-type optical sensor circuit is illustrated by Table 1 below.

TABLE 1

| FLAG POSITION | TR1 | Q1 | LED1 | Q1 EMITTER |
|---|---|---|---|---|
| FLAG IN | OFF | OFF | OFF | LOW |
| FLAG OUT | ON | ON | ON | HIGH |

Referring now to FIG. 2, the open-type optical sensor circuit comprises an optical sensor 20, a position sensing driver 22, a LED "LED2", and first and second resistors R1 and R12. Optical sensor 20 comprises a LED "D2" and a light receiving transistor TR2 that is turned on in response to light emitted by LED D2. A flag "FLAG" is inserted or input between LED D2 and light receiving transistor TR2 to prevent the light emitted from LED D2 from turning on light receiving transistor TR2. Position sensing driver 22 comprises a transistor Q2 having a base connected to a collector of light receiving transistor TR2, a collector connected to an output of LED "LED2", and an emitter connected to an output of the open-type optical sensor.

The operation of the open-type optical sensor circuit is as follows. Where flag "FLAG" is not interposed between LED D2 and light receiving transistor T2, the collector of light receiving transistor T2 assumes logic state "low", causing transistor Q2 to turn off. Accordingly, no current flows through LED "LED2", and as a result, the emitter of transistor Q2 assumes logic state "low". In contrast, where flag "FLAG" is interposed between LED D2 and light receiving transistor T2, the collector of light receiving transistor T2 assumes logic state "high", causing transistor Q1 to turn on. Accordingly, current flows through LED "LED2", thus turning it on, and as a result, the emitter of transistor Q2 assumes logic state "high".

The operation of the close-type optical sensor circuit is illustrated by Table 2 below.

TABLE 2

| FLAG POSITION | TR2 | Q2 | LED2 | Q2 EMITTER |
|---|---|---|---|---|
| FLAG IN | OFF | ON | ON | HIGH |
| FLAG OUT | ON | OFF | OFF | LOW |

In the description above, the close-type optical sensor circuit outputs a high signal when no flag is input to optical sensor 10, and the open-type optical sensor circuit outputs a low signal when no flag is input to optical sensor 20. Conversely, where a flag is input to optical sensor 10, the close-type optical sensor circuit outputs a low signal and where a flag is input to optical sensor 20, the open-type optical sensor circuit outputs a high signal.

The output of the closed or open type optical sensor generally provides an indication of the state of some component in a semiconductor manufacturing device. For example, the output may represent whether a door in the device is open or closed. The optical sensor typically detects the state of the component by the presence or absence of the flag.

The optical sensor circuits described above are commonly employed in semiconductor manufacturing equipment. For example, in a semiconductor manufacturing apparatus comprising a processing chamber and a plurality of load lock chambers connected to the process chamber, optical sensor circuits may be used to determine whether the load-lock chambers are properly closed or whether an air bearing in the processing chamber is properly oriented.

Where a close-type or open-type optical sensor circuit is used in the load lock chambers of a semiconductor manufacturing apparatus, malfunctions in one optical sensor circuit can be addressed without interrupting semiconductor manufacturing processes in the processing chamber. This can be accomplished, for example, by removing the malfunctioning optical sensor circuit from its respective load lock chamber and using a different load lock chamber to perform process steps. However, where a close-type or open-type optical sensor circuit is used in the processing chamber, malfunctions in the optical sensor circuit cannot be addressed without interrupting semiconductor manufacturing processes performed therein.

SUMMARY OF THE INVENTION

According to one embodiment of the invention, an optical sensor circuit adapted for use in a semiconductor manufacturing apparatus is provided. The optical sensor circuit comprises an optical sensor adapted to sense a position of a component in the semiconductor manufacturing apparatus according to the presence or absence of a flag and output a signal indicative of the position, and a position sensing driver receiving the signal via a path selected by a plurality of switches and driving an output signal in response to the signal.

According to another embodiment of the invention, another optical sensor circuit adapted for use in a semiconductor manufacturing apparatus is provided. The optical sensor circuit comprises an optical sensor adapted to sense a position of a component in the semiconductor manufacturing apparatus according to the presence or absence of a flag, a pull-up resistor connected between a power supply and the optical sensor, and a pull-down resistor connected between the optical sensor and ground. The optical sensor circuit further comprises a first switch connected between the power supply and the optical sensor, a second switch connected between the optical sensor and ground, a position sensing driver comprising a transistor having a base, an emitter, and a collector, a third switch connected between the optical sensor and the base of the transistor, and a fourth switch connected between the base of the transistor and the optical sensor.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 3:
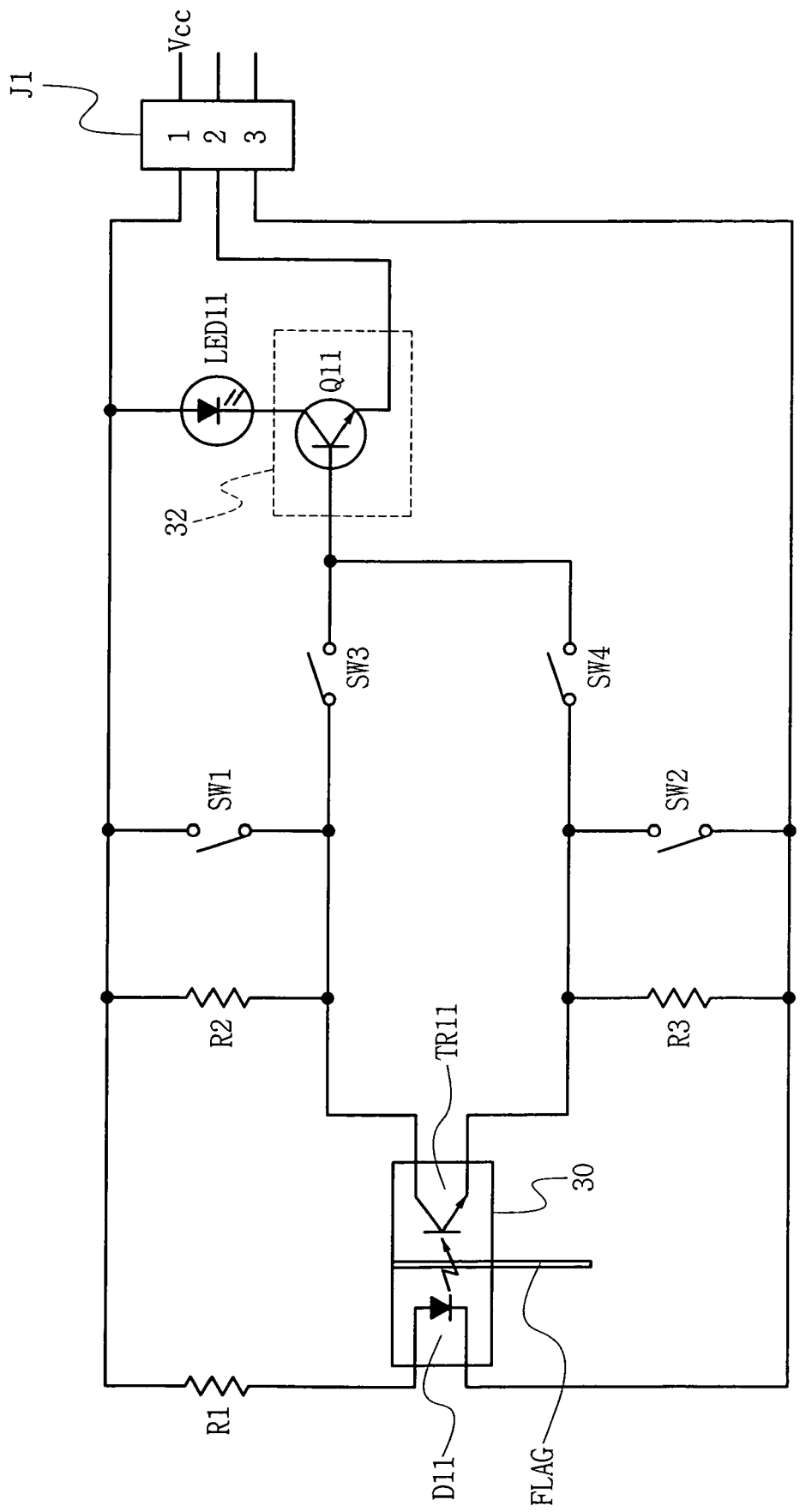
FIG. 3 is a diagram of an optical sensor circuit combining the functions of a close-type and open-type optical sensor circuit according to one embodiment of the present invention.

FIG. 3 is a diagram of an optical sensor circuit combining the functions of a close-type and open-type optical sensor circuit according to one embodiment of the present invention.

Referring to FIG. 3, the optical sensor circuit comprises an optical sensor 30, a position sensing driver 32, a LED "LED11", first and second pull-up resistors R1 and R2, a pull down resistor R3, and first through fourth switches SW1 through SW4. The optical sensor circuit further comprises a connecter J1 connecting the optical sensor circuit to a power supply Vcc (1), an output terminal (2), and ground (3).

Optical sensor 30 comprises a LED D11 connected between first pull-up resistor R1 and ground. Optical sensor 30 further comprises a light receiving transistor TR11 having an emitter and a collector and turning on in response to light emitted by LED D11. A flag "FLAG" is inserted or input between LED D11 and light receiving transistor TR11 to prevent the light emitted from LED D11 from turning on light receiving transistor TR11.

Position sensing driver 32 comprises a negative-positive-negative (NPN) bipolar transistor Q11 connected between an output of LED LED11 and the output terminal. Transistor Q11 has a base connected to switch SW3, a collector connected to the output of LED LED11, and an emitter connected to the output terminal.

In FIG. 3, first pull-up resistor R1 is connected between the power supply and LED D11, second pull-up resistor R2 is connected between the power supply and the collector of light receiving transistor TR11, and pull-down resistor R3 is connected between the emitter of light receiving transistor TR11 and ground.

First switch SW1 is connected between the power supply and the collector of light receiving transistor TR11, second switch SW2 is connected between the emitter of light receiving transistor TR11 and ground, third switch SW3 is connected between the collector of light receiving transistor TR11 and the base of transistor Q11, and fourth switch SW4 is connected between the emitter of light receiving transistor TR11 and the base of transistor Q11.

Figure 1:
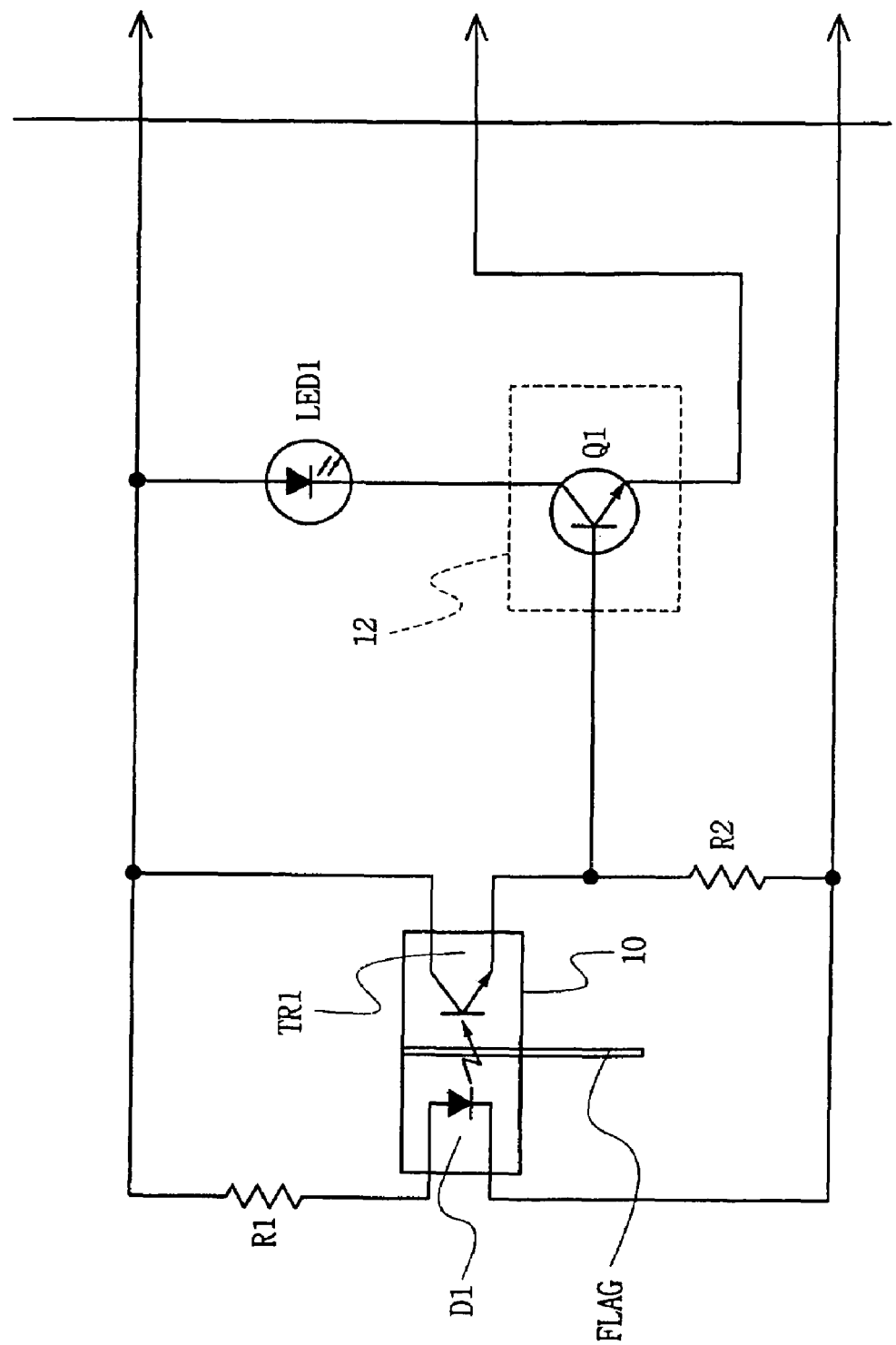
FIG. 1 is a diagram of a conventional close-type optical sensor circuit.
Figure 2:
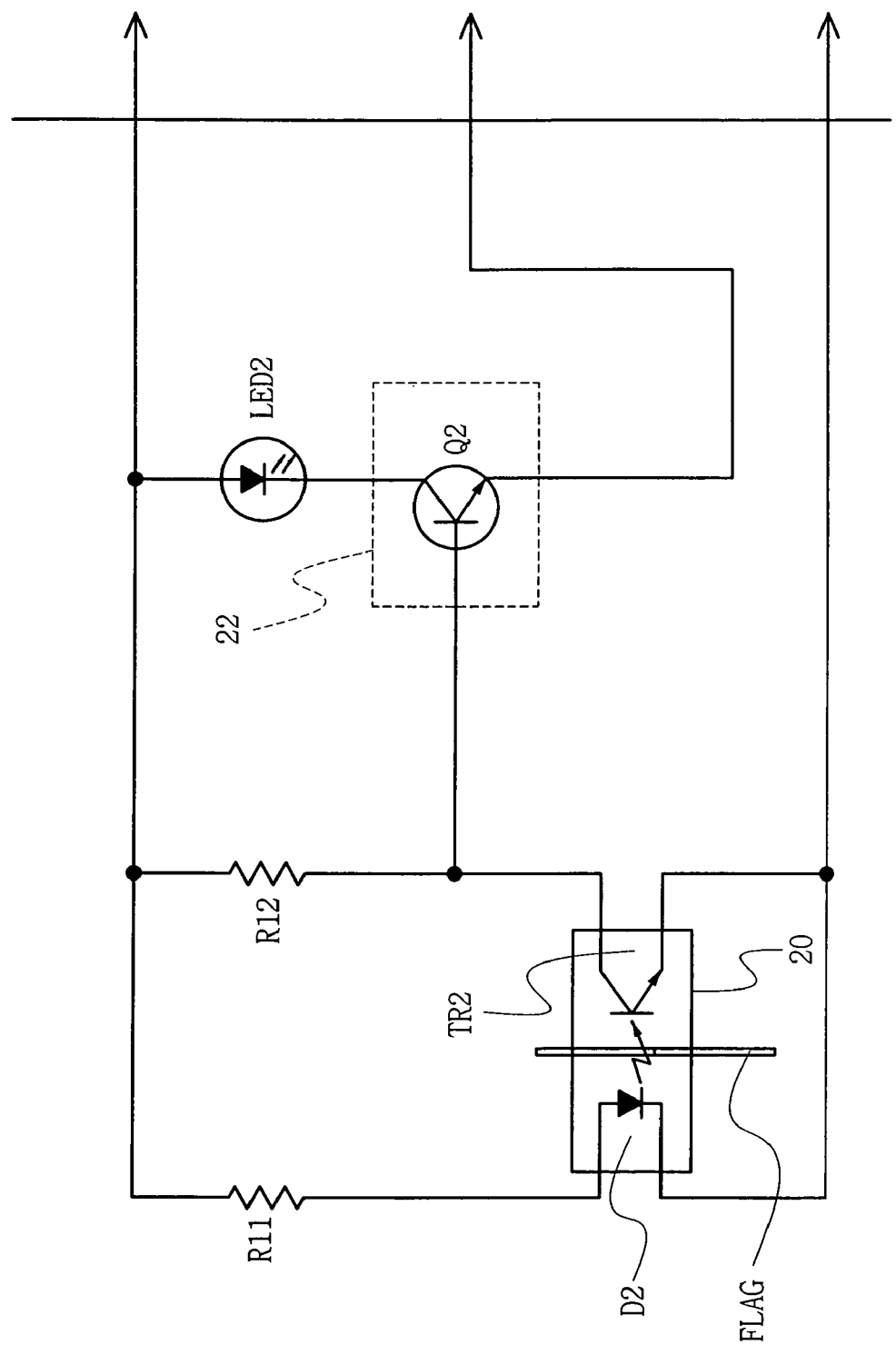
FIG. 2 is a diagram of a conventional open-type optical sensor circuit.

By selectively closing (or turning on) first through fourth switches SW1 through SW4, the optical sensor circuit of FIG. 3 can perform the functions of the close-type optical sensor circuit of FIG. 1 or the functions of the open-type optical sensor circuit of FIG. 2. As illustrated by the following table 3, the optical sensor circuit of FIG. 3 acts as an open-type optical sensor circuit when second and third switches SW2 and SW3 are on and first and fourth switches SW1 and SW4 are off. The optical sensor circuit of FIG. 3 acts as a close-type optical sensor circuit when first and fourth switches SW1 and SW4 are turned on and second and third switches SW2 and SW3 are turned off.

TABLE 3

| OPTICAL SENSOR CIRCUIT TYPE | SW1 | SW2 | SW3 | SW4 |
|---|---|---|---|---|
| CLOSE-TYPE | ON | OFF | OFF | ON |
| OPEN-TYPE | OFF | ON | ON | OFF |

Where the optical sensor circuit of FIG. 3 functions as the close-type optical sensor circuit, the output terminal receives a high signal whenever flag "FLAG" is not interposed between LED D11 and light receiving transistor TR11, and the output terminal receives a low signal whenever flag "FLAG" is interposed between LED D11 and light receiving transistor TR11. On the other hand, where the optical sensor circuit of FIG. 3 functions as the open-type optical sensor circuit, the output terminal receives a low signal whenever flag "FLAG" is not interposed between LED D11 and light receiving transistor TR11, and the output terminal receives a high signal whenever flag "FLAG" is interposed between LED D11 and light receiving transistor TR11.

Where the optical sensor circuit acts as the closed-type optical sensor circuit and flag "FLAG" is not interposed between LED D11 and light receiving transistor TR11, light receiving transistor TR11 is turned on, and fourth switch SW4 connects the emitter of light receiving transistor TR11 to the base of transistor Q11 to turn on transistor Q11. Current then flows through LED11 and transistor Q11 to output a high signal on the output terminal.

Where the optical sensor circuit acts as the closed-type optical sensor circuit and flag "FLAG" is interposed between LED D11 and light receiving transistor TR11, light receiving transistor TR11 is turned off, and fourth switch SW4 connects the base of transistor Q11 to ground through pull-down resistor R3. Therefore, no current flows through LED11 and transistor Q11, and therefore a low signal is output to the output terminal.

Where the optical sensor circuit acts as the open-type optical sensor circuit and flag "FLAG" is not interposed between LED D11 and light receiving transistor TR11, light receiving transistor TR11 is turned on, and third switch SW3 connects the base of transistor Q11 to a low voltage to turn transistor Q11 off. Accordingly, no current flows through LED11 and therefore transistor Q11 outputs a low signal on the output terminal.

Where the optical sensor circuit acts as the open-type optical sensor circuit and flag "FLAG" is interposed between LED D11 and light receiving transistor TR11, light receiving transistor TR11 is turned off, and third switch SW3 connects the base of transistor Q11 to the power supply through second pull-up resistor R2. Accordingly, transistor Q11 is turned on and current flows through LED11. As a result, a high signal is sent to the output terminal.

Because the optical sensor circuit shown in FIG. 3 is capable of acting as both a close-type optical sensor circuit and an open-type optical sensor circuit, semiconductor manufacturing processes do not necessarily have to be terminated when a part of the optical sensor circuit malfunctions. Accordingly, the productivity of semiconductor manufacturing processes are greatly enhanced in the face of optical sensor circuit malfunctions.

Although the optical sensor circuit shown in FIG. 3 contains bi-polar NPN transistors, transistors with other polarities (i.e., PNP transistors) could also be used instead, and the polarities of signals could be modified accordingly to produce output signals in accordance with the desired functionality of the optical sensor circuit.

Various types of switches could be used to form the circuit shown in FIG. 3. For example, dual in-line package (DIP) switches, transistors, and the like could be used. In general, the switches are turned on and off by a control circuit (not shown) so that either switches SW1 and SW4 are on at the same time while switches SW2 and SW3 are off in order to perform like a close-type optical sensor circuit or switches SW2 and SW3 are on at the same time while switches SW1 and SW4 are off in order to perform like an open-type optical sensor circuit.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. An optical sensor circuit adapted for use in a semiconductor manufacturing apparatus, the optical sensor circuit comprising:
    an optical sensor sensing a position of a component in the semiconductor manufacturing apparatus according to the presence or absence of a flag and providing a signal indicative of the position; and,
    a position sensing driver receiving the signal via a path selected by a plurality of switches and driving an output signal in response to the signal, wherein the plurality of switches comprises:
        first and second switches forming a first path providing the signal to the position sensing driver with a first logic state when the flag is present and a second logic state when the flag is absent; and,
        third and fourth switches forming a second path providing the signal to the position sensing driver with the second logic state when the flag is present and the first logic state when the flag is absent.

2. The optical sensor circuit of claim 1, further comprising: a light emitting diode turned on or off in response to the position sensing driver driving the output signal.

3. The optical sensor circuit of claim 1, wherein the optical sensor comprises a light emitting diode and a light receiving transistor turned on in response to light emitted by the light emitting diode.

4. The optical sensor circuit of claim 1, wherein the position sensing driver comprises a bi-polar transistor.

5. The optical sensor circuit of claim 4, wherein the bi-polar transistor is a negative-positive-negative (NPN) transistor.

6. The optical sensor circuit of claim 1, wherein the plurality of switches are dual in-line package (DIP) switches.

7. An optical sensor circuit adapted for use in a semiconductor manufacturing apparatus, the optical sensor circuit comprising:
    an optical sensor sensing a position of a component in the semiconductor manufacturing apparatus according to the presence or absence of a flag;
    a pull-up resistor connected between a power supply and the optical sensor;
    a pull-down resistor connected between the optical sensor and ground;
    a first switch connected between the power supply and the optical sensor;
    a second switch connected between the optical sensor and ground;

a position sensing driver comprising a transistor having a base, an emitter, and a collector;

a third switch connected in a first signal path between the optical sensor and the base of the transistor; and, a fourth switch connected in a second signal oath between the optical sensor and the base of the transistor.

8. The optical sensor circuit of claim 7, further comprising: a first light emitting diode connected between the power supply and the collector of the transistor.

9. The optical sensor circuit of claim 8, wherein the optical sensor comprises a second light emitting diode connected between the power supply and ground, and a light receiving transistor receiving light emitted by the second light emitting diode.

10. The optical sensor circuit of claim 9, wherein the position sensing driver comprises a negative-positive-negative (NPN) transistor.

11. The optical sensor circuit of claim 9, wherein the flag prevents the light receiving transistor from receiving the light emitted by the second light emitting diode, thereby turning off the light receiving transistor.

12. The optical sensor circuit of claim 7, wherein the first, second, third, and fourth switches are dual in-line package (DIP) switches.

13. The optical sensor circuit of claim 7, further comprising:

a connecter connecting (1) the first switch, the pull-up resistor, and the optical sensor to the power supply; (2) the emitter of the transistor to an output terminal; and, (3) the optical sensor, the pull-down resistor, and the second switch to ground.

14. The optical sensor circuit of claim 9, wherein the light receiving transistor comprises an emitter and a collector;

wherein the emitter of the light receiving transistor is connected in the second signal path to the pull-down resistor, the second switch, and the fourth switch; and, wherein the collector of the light receiving transistor is connected in the first signal path to the pull-up resistor, the first switch, and the third switch.

15. The optical sensor of claim 7, wherein the flag indicates whether a load lock chamber is open or closed.

* * * * *